US012666560B2

(12) United States Patent
Yang et al.

(10) Patent No.:  US 12,666,560 B2
(45) Date of Patent:  Jun. 23, 2026

(54) UPTURNED ELECTRIC CONTROL BOX MOUNTING STRUCTURE AND HEAT PUMP DEVICE APPLYING SAME

(71) Applicants:Guangdong Aini Intelligent Household Electrical Appliance Manufacturing Co., Ltd, Foshan (CN); Guangdong Warmhouse Technology Co., Ltd., Foshan (CN)

(72) Inventors: Yucong Yang, Foshan (CN); Fei Yang, Foshan (CN); Peiming Chen, Foshan (CN); Weitao Chen, Foshan (CN)

(73) Assignees: Guangdong Aini Intelligent Household Electrical Appliance Manufacturing Co., Ltd, Foshan (CN); Guangdong Warmhouse Technology Co., Ltd., Foshan (CN)

( * ) Notice: Subject to any disclaimer, the term of this patent is extended or adjusted under 35 U.S.C. 154(b) by 332 days.

(21) Appl. No.: 18/378,840

(22) Filed: Oct. 11, 2023

(65) Prior Publication Data

US 2024/0040737 A1     Feb. 1, 2024

(30) Foreign Application Priority Data

Jun. 9, 2023    (CN) .......................... 202310681169.7

(51) Int. Cl.
*H05K 7/18*          (2006.01)
*F25B 30/06*         (2006.01)
(52) U.S. Cl.
CPC .............. *H05K 7/18* (2013.01); *F25B 30/06* (2013.01)

(58) Field of Classification Search
CPC ........... F24H 9/02; F24H 9/06; H05K 5/0226; H05K 7/18
See application file for complete search history.

(56) References Cited

U.S. PATENT DOCUMENTS 6,330,161 B1 * 12/2001 Smith ..................... G06F 1/181
                                                    16/265
2004/0043646 A1   3/2004 Takeuchi et al.
2005/0233619 A1  10/2005 Takeuchi et al.
2006/0030176 A1   2/2006 Ikeda et al.

FOREIGN PATENT DOCUMENTS

CN        204165216 U   *   2/2015
CN        208720457 U   *   4/2019
CN        215260045 U   *  12/2021    ........... F24H 9/2021
KR     20060015974 A   *   2/2006    ................ F24F 1/22

* cited by examiner

*Primary Examiner* — Eric S Ruppert
(74) *Attorney, Agent, or Firm* — Shen Huang

(57)              ABSTRACT
The present disclosure relates to the technical field of a heat pump device, and discloses an upturned electric control box mounting structure, which comprises a connecting frame and an electric control box assembly, wherein the electric control box assembly is connected to the connecting frame in an upturned manner, a fixing mechanism and a supporting mechanism are provided on the connecting frame. The present disclosure further discloses a heat pump device applying the structure, which comprises a tank body, a water tank assembly and a hydraulic module, wherein the above-mentioned upturned electric control box mounting structure is mounted on the tank body, and the water tank assembly and the hydraulic module are electrically connected with the electric control box assembly.

7 Claims, 9 Drawing Sheets

UPTURNED ELECTRIC CONTROL BOX MOUNTING STRUCTURE AND HEAT PUMP DEVICE APPLYING SAME

TECHNICAL FIELD

The present disclosure relates to the technical field of a heat pump device, in particular to an upturned electric control box mounting structure and a heat pump device applying the same.

BACKGROUND

A heat pump is an energy-saving device that can make heat flow from a low-level heat source to a high-level heat source by using a high-level energy, which can obtain a large amount of heat supply only by consuming a small amount of reverse circulation net power. In the related art, a hydraulic module is a part of a heat pump unit and is a place where water and refrigerants exchange heat. In the existing design of the hydraulic module, an electric control box is usually mounted by being directly fixed to a chassis. In a use process, since pipelines inside the hydraulic module are mostly connected by threads, the aging of a sealing ring after long-term operation will lead to water leakage. In the maintenance of the hydraulic module, a wrench has no operating space due to the interference of the mounting position of the electric control box and the space limitation, which has the disadvantages of great maintenance difficulty and low overhaul efficiency.

SUMMARY

The technical problem to be solved by the present disclosure is to overcome the shortcomings in the prior art, and to provide an upturned electric control box mounting structure and a heat pump device applying the structure, which are simple in structure, are capable of avoiding interference and obstruction of the electric control box to an internal space during maintenance, effectively reducing maintenance difficulty and improving an overhaul efficiency, and are more convenient to use.

In order to solve the technical problems, the present disclosure uses the following technical scheme.

The present disclosure relates to an upturned electric control box mounting structure, comprising a connecting frame and an electric control box assembly, wherein the electric control box assembly is connected to the connecting frame in an upturned manner and is capable of being switched between an assembled state and an overhaul state through an overturning action, and the connecting frame is provided with a fixing mechanism for keeping the electric control box assembly in an assembled state and a supporting mechanism for keeping the electric control box assembly in an overhaul state.

As a further improvement of the above technical scheme:

the connecting frame comprises a first side frame and a second side frame, a first upper connecting pipe and a second upper connecting pipe are fixedly connected between the first side frame and the second side frame, and the electric control box assembly is rotatably connected to the first upper connecting pipe through several groups of hinges.

The fixing mechanism comprises at least two groups of connecting plates detachably connected with the electric control box assembly, and at least one group of connecting plates are provided on the first side frame and the second side frame, respectively.

The connecting plate is rotatably connected to the first side frame and the second side frame and is capable of being switched between a storage state and a connecting state by a rotating action.

The connecting plate is provided with an abutting part abutting against the first side frame or the second side frame to position the connecting plate in a connected state.

The supporting mechanism comprises at least two groups of supporting rods detachably connected with the electric control box assembly, and at least one group of supporting rods are provided on the first side frame and the second side frame, respectively.

The supporting rod is rotatably connected to the first side frame and the second side frame and is capable of being switched between a storage state and a connected state by a rotating action.

The electric control box assembly comprises a box body, an electric control component provided in the box body, and a box cover covered on the box body, and both sides of the box body are provided with abutting elements abutting against the connecting plate, respectively.

The box body and the box cover are detachably connected through a fastening mechanism and a locking mechanism, the fastening mechanism comprises fastening flanges, which are provided at both sides of the box body, respectively, and fastening protrusions, which are provided at both sides of the box cover, respectively, and the fastening protrusions are in clamping connection with the fastening flanges; the locking mechanism comprises a positioning plate provided on the box body, the positioning plate is provided with a first through hole, and the box cover is provided with a second through hole; the box cover is further provided with a handle.

The present disclosure relates to a heat pump device, comprising a tank body, a water tank assembly and a hydraulic module, wherein the upturned electric control box mounting structure is mounted on the tank body, and the water tank assembly and the hydraulic module are electrically connected with the electric control box assembly.

Compared with the prior art, the present disclosure has the following advantages.

The present disclosure relates to an upturned electric control box mounting structure, which comprises a connecting frame and an electric control box assembly, wherein the electric control box assembly is connected to the connecting frame in an upturned manner. When the electric control box assembly is in an assembled state, the whole electric control box assembly is located in an accommodating space, so that the electric control box assembly has the advantages of a compact structure and a small occupied space. When the electric control box assembly is in an overhaul state, the whole electric control box assembly is located outside the accommodating space, which can avoid interference and obstruction of the electric control box to an internal space of the connecting frame and the space limitation.

The heat pump device of the present disclosure comprises a tank body. A water tank assembly is provided in the tank body. A hydraulic module is provided above the water tank assembly. An upturned electric control box mounting structure for accommodating the hydraulic module is further mounted on the tank body, wherein the upturned electric control box mounting structure comprises a connecting frame and an electric control box assembly. An accommodating space is provided in the connecting frame. The electric control box assembly is connected to the connecting frame in an upturned manner. When the electric control box assembly is in an assembled state, the electric control box assembly and the hydraulic module are integrally located in an accommodating space, so that the electric control box assembly has the advantages of a compact structure and a small occupied space. When the hydraulic module needs to be overhauled, the electric control box assembly is upturned and kept in the overhaul state, and the whole electric control box assembly is located outside the accommodating space, which can avoid the interference and obstruction to the maintainer, effectively reduce maintenance difficulty and improve overhaul efficiency. It is more convenient to use.

DESCRIPTION OF LEGENDS

1. Connecting frame; 101. First side frame; 102. Second side frame; 103. First upper connecting pipe; 104. Second upper connecting pipe; 2. Electric control box assembly; 201. Box body; 202. Electric control component; 203. Box cover; 204. Abutting element; 205. Handle; 3. Fixing mechanism; 301. Connecting plate; 302. Abutting part; 4. Supporting mechanism; 401. Supporting rod; 5. Hinge; 6. Fastening mechanism; 601. Fastening flange; 602. Fastening protrusion; 7. Locking mechanism; 701. Positioning plate; 702. First through hole; 703. Second through hole; 8. Tank body; 9. Water tank assembly; 10. Hydraulic module.

DETAILED DESCRIPTION OF THE EMBODIMENTS

The present disclosure will be further described in detail with the attached drawings and specific embodiments.

Figure 1:
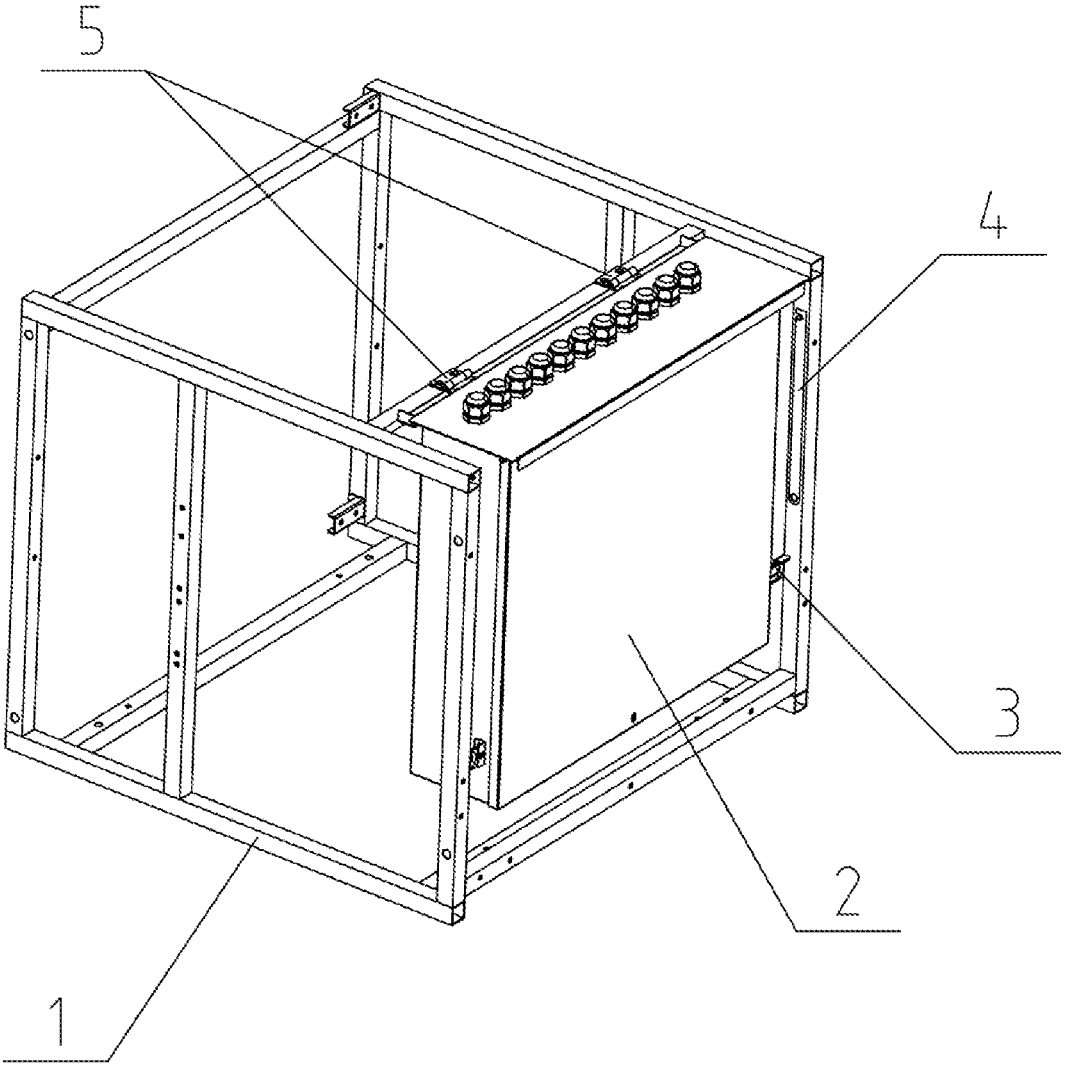
FIG. 1 is a schematic structural view of an upturned electric control box mounting structure in an assembled state.
Figure 2:
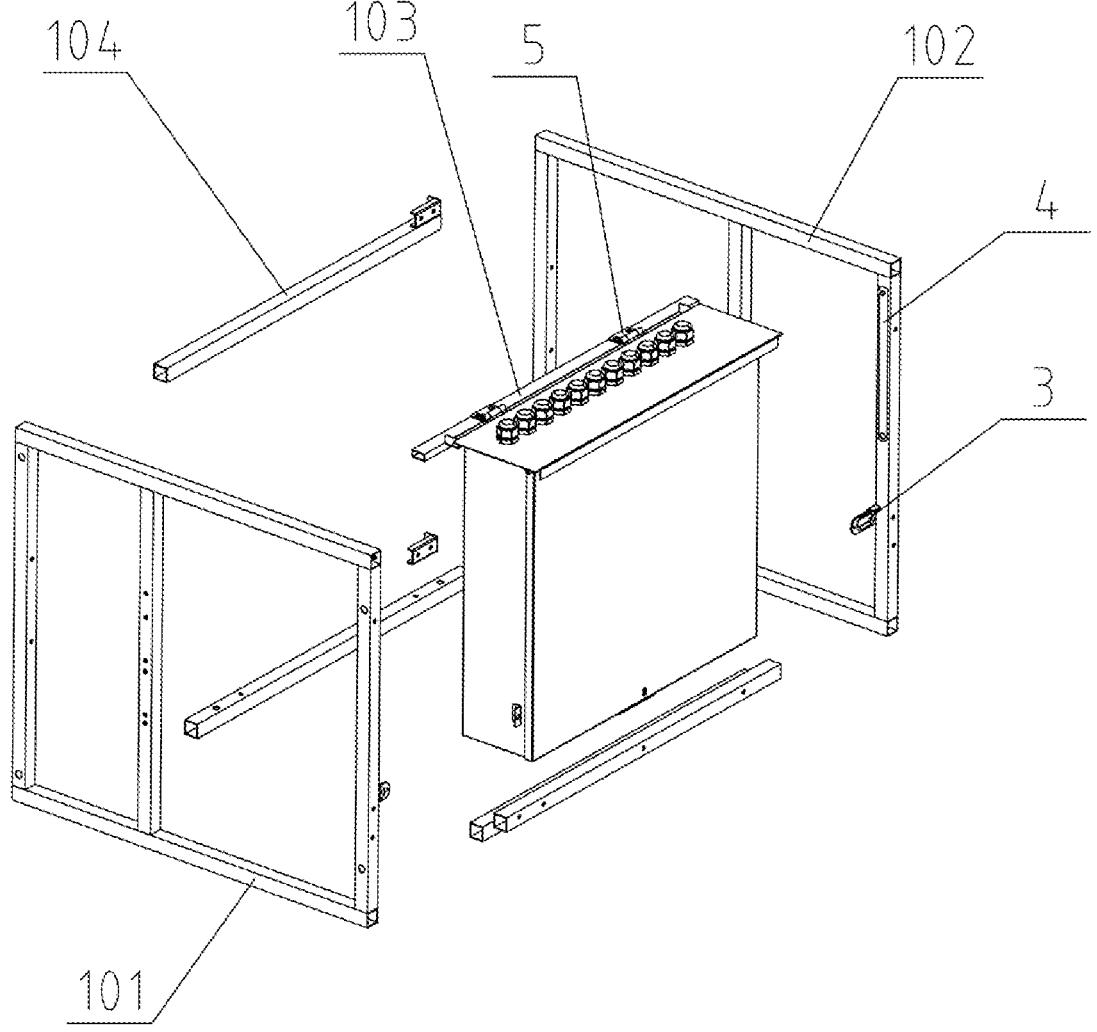
FIG. 2 is an exploded view of an upturned electric control box mounting structure.

As shown in FIG. 1 and FIG. 2, the upturned electric control box mounting structure of this embodiment comprises a connecting frame 1 and an electric control box assembly 2. The electric control box assembly 2 is connected to the connecting frame 1 in an upturned manner and is capable of being switched between an assembled state and an overhaul state through an overturning action. The connecting frame 1 is provided with a fixing mechanism 3 for keeping the electric control box assembly 2 in an assembled state and a supporting mechanism 4 for keeping the electric control box assembly 2 in an overhaul state. The upturned electric control box mounting structure comprises a connecting frame 1 and an electric control box assembly 2. The electric control box assembly 2 is connected to the connecting frame 1 in an upturned manner. When the electric control box assembly 2 is in an assembled state, the whole electric control box assembly 2 is located in an accommodating space, so that the electric control box assembly has the advantages of a compact structure and a small occupied space. When the electric control box assembly 2 is in an overhaul state, the whole electric control box assembly 2 is located outside the accommodating space, which can avoid interference and obstruction of the electric control box 2 to an internal space of the connecting frame 1 and the space limitation.

Preferably, the connecting frame 1 comprises a first side frame 101 and a second side frame 102, a first upper connecting pipe 103 and a second upper connecting pipe 104 are fixedly connected between the first side frame 101 and the second side frame 102, and the electric control box assembly 2 is rotatably connected to the first upper connecting pipe 103 through several groups of hinges 5. In this embodiment, the connecting frame 1 comprises a first side frame 101 and a second side frame 102. The upper part between the first side frame 101 and the second side frame 102 is fixedly connected with a first upper connecting pipe 103 and a second upper connecting pipe 104, and the lower part thereof is fixedly connected with at least two groups of lower connecting pipes, which form a cubic frame structure with accommodation space. Specifically, the electric control box assembly 2 is rotatably connected to the first upper connecting pipe 103 through at least two groups of hinges 5, which has the advantages of a simple structure, a large opening angle and a low cost.

Figure 3:
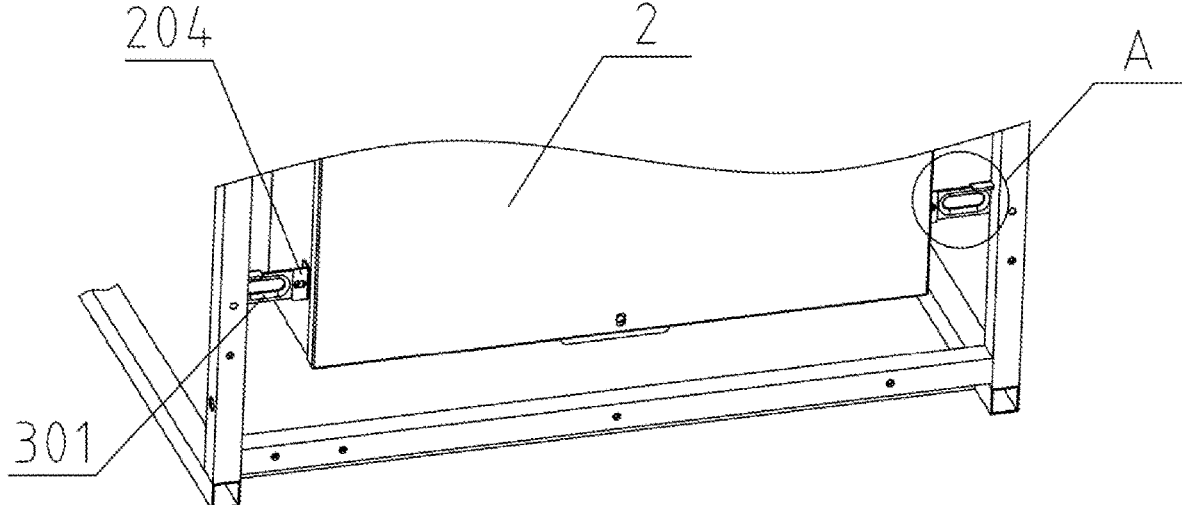
FIG. 3 is a schematic structural view of a fixing mechanism when an upturned electric control box mounting structure is in an assembled state.
Figure 4:
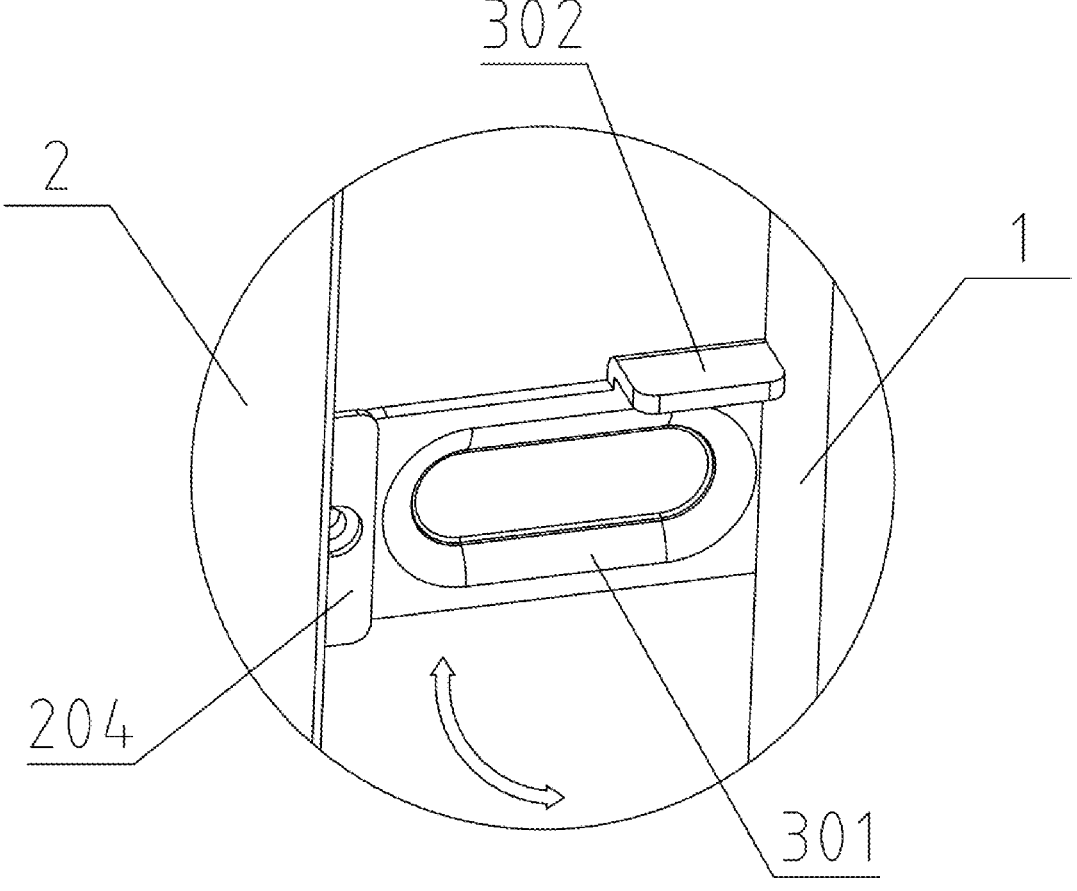
FIG. 4 is an enlarged view of detail A in FIG. 3.

As shown in FIGS. 3 and 4, preferably, the fixing mechanism 3 comprises at least two groups of connecting plates 301 detachably connected with the electric control box assembly 2, and at least one group of connecting plates 301 are provided on the first side frame 101 and the second side frame 102, respectively. In this embodiment, both sides of the connecting frame 1 are provided with a group of connecting plates 301, respectively. The connecting plates 301 can be connected to the first side frame 101 and the second side frame 102 in the form of fixed mounting or movable mounting according to the user demand. When the electric control box assembly 2 is in an assembled state, the electric control box assembly 2 is fixedly connected with the connecting plates 301, which can prevent the electric control box assembly 2 from shaking on the connecting frame 1 and causing impact damage to mechanisms therein, and has the advantages of a simple structure and a convenient and quick assembly. In other embodiments, the first side frame 101 and the second side frame 102 may be provided with two or more groups of connecting plates 301, respectively, so as to further improve the connection stability of the electric control box assembly 2.

Preferably, the connecting plate 301 is rotatably connected to the first side frame 101 and the second side frame 102 and is capable of being switched between a storage state and a connecting state by a rotating action. In this embodiment, in order to further prevent the connecting plate 301 from interfering with and obstructing the maintainer, the connecting plate 301 is connected to the first side frame 101 and the second side frame 102 in the form of movable mounting. Specifically, the connecting plate 301 is rotatably connected to the first side frame 101 and the second side frame 102 through a pin shaft. The connecting plate 301 can rotate around the shaft with respect to the first side frame 101 and the second side frame 102. When the connecting plate 301 is fixedly connected with the electric control box assembly 2, the connecting plate 301 is in a connected state, that is, the length extension direction of the connecting plate 301 is parallel to the horizontal ground. When the connecting plate 301 is released from the fixed connection relationship with the electric control box assembly 2, the connecting plate 301 rotates around the shaft under the action of gravity until the length extension direction of the connecting plate 301 is perpendicular to the horizontal ground, and the connecting plate 301 is in a storage state.

Preferably, the connecting plate 301 is provided with an abutting part 302 abutting against the first side frame 101 or the second side frame 102 to position the connecting plate 301 in a connected state. In this embodiment, the connecting plate 301 is bent and formed with the abutting part 302. When the connecting plate 301 rotates, the connecting plate 301 rotates to the position in a connected state. At this time, the abutting part 302 abuts against a vertical member of the first side frame 101 or the second side frame 102, which prevents the connecting plate 301 from continuing to rotate upward, so that the connecting plate 301 is positioned at the position in a connected state, which avoids the situation that the position of the connecting plate 301 is repeatedly adjusted and calibrated during the fixed connection between the connecting plate 301 and the electric control box assembly 2, greatly improves the position accuracy, and improves the assembly efficiency.

Figure 5:
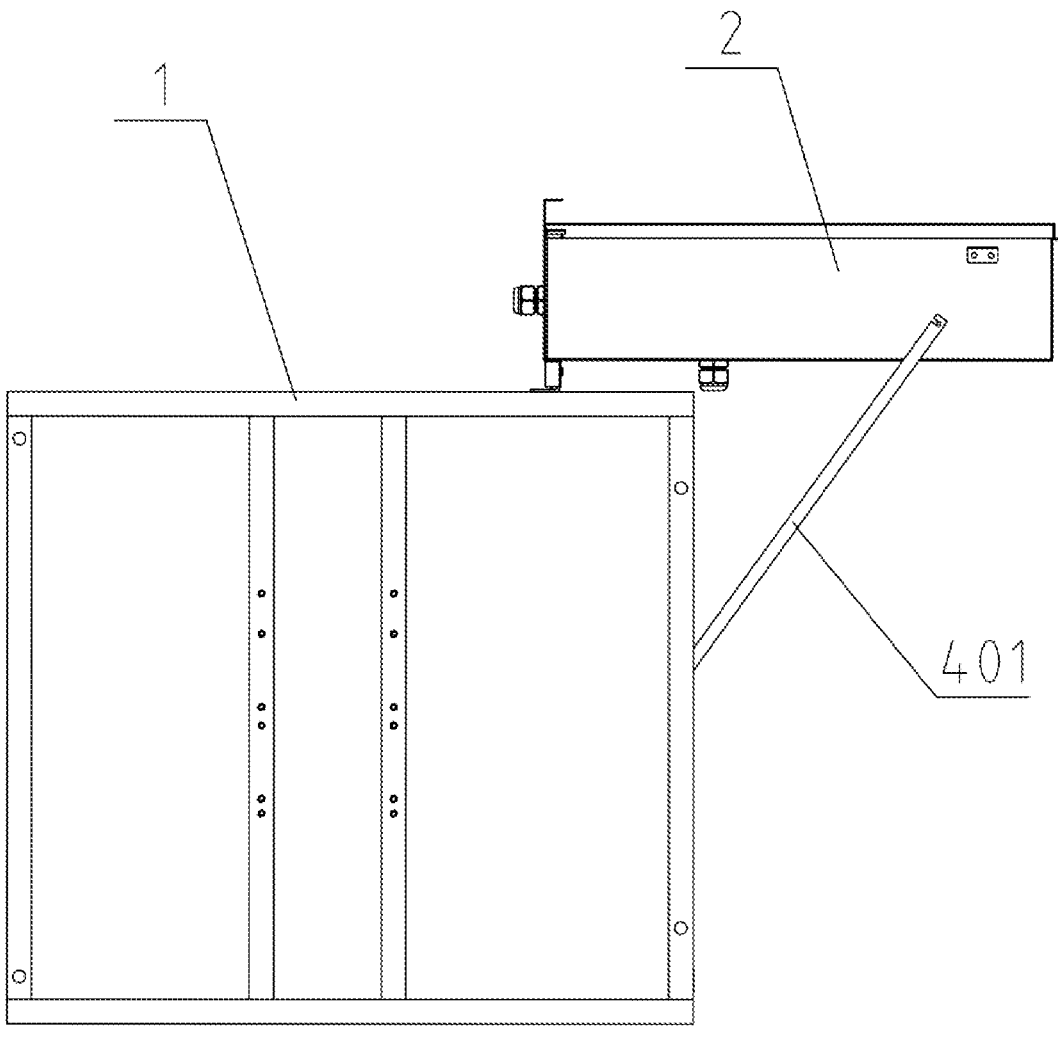
FIG. 5 is a side view of an upturned electric control box mounting structure in an overhaul state.

As shown in FIG. 5, preferably, the supporting mechanism 4 comprises at least two groups of supporting rods 401 detachably connected with the electric control box assembly 2, and at least one group of supporting rods 401 are provided on the first side frame 101 and the second side frame 102, respectively. In this embodiment, both sides of the connecting frame 1 are provided with a group of supporting rods 401, respectively. The supporting rods 401 can be connected to the first side frame 101 and the second side frame 102 in the form of fixed mounting or movable mounting according to the user demand. When the electric control box assembly 2 is in an overhaul state, the electric control box assembly 2 is fixedly connected with the supporting rods 401, which can provide support for the electric control box assembly 2. In this way, the whole electric control box assembly 2 can always be kept above the connecting frame 1, which has the advantages of a simple structure and a good connection stability. In other embodiments, the first side frame 101 and the second side frame 102 can also be provided with two or more groups of supporting rods 401, respectively, so as to further improve the connection stability of the electric control box assembly 2.

Preferably, the supporting rod 401 is rotatably connected to the first side frame 101 and the second side frame 102 and is capable of being switched between a storage state and a connected state by a rotating action. In this embodiment, in order to further prevent the supporting rod 401 from interfering with other structures on the connecting frame 1, the supporting rod 401 is connected to the first side frame 101 and the second side frame 102 in the form of movable mounting. Specifically, the supporting rod 401 uses a piston rod with a telescopic function. The piston rod comprises a cylinder and a telescopic rod. The cylinder is rotatably connected to the first side frame 101 and the second side frame 102 through a pin shaft. The cylinder rotates at a certain angle and drives the telescopic rod to extend out, so that one end of the telescopic rod can be fixedly connected with the electric control box assembly 2. In this way, the electric control box assembly 2 is kept in an overhaul state, and the supporting rod 401 is in a connected state at this time. When the telescopic rod is released from the fixed connection relationship with the electric control box assembly 2, the supporting rod 401 is reset until the length extension direction of the supporting rod 401 is perpendicular to the horizontal ground, and the supporting rod 401 is in a storage state.

Figure 6:
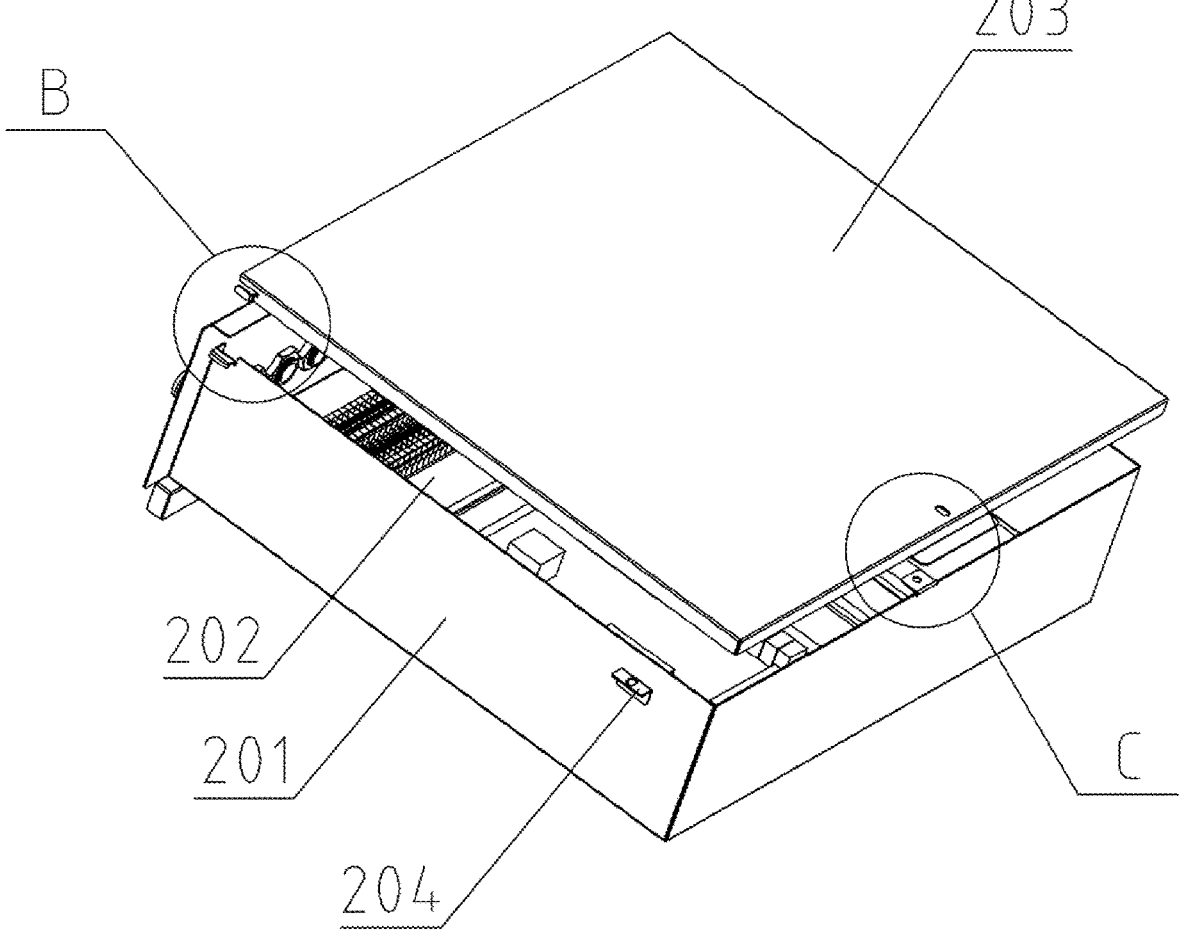
FIG. 6 is a structural view of an exploded state of an electric control box assembly.
Figure 7:
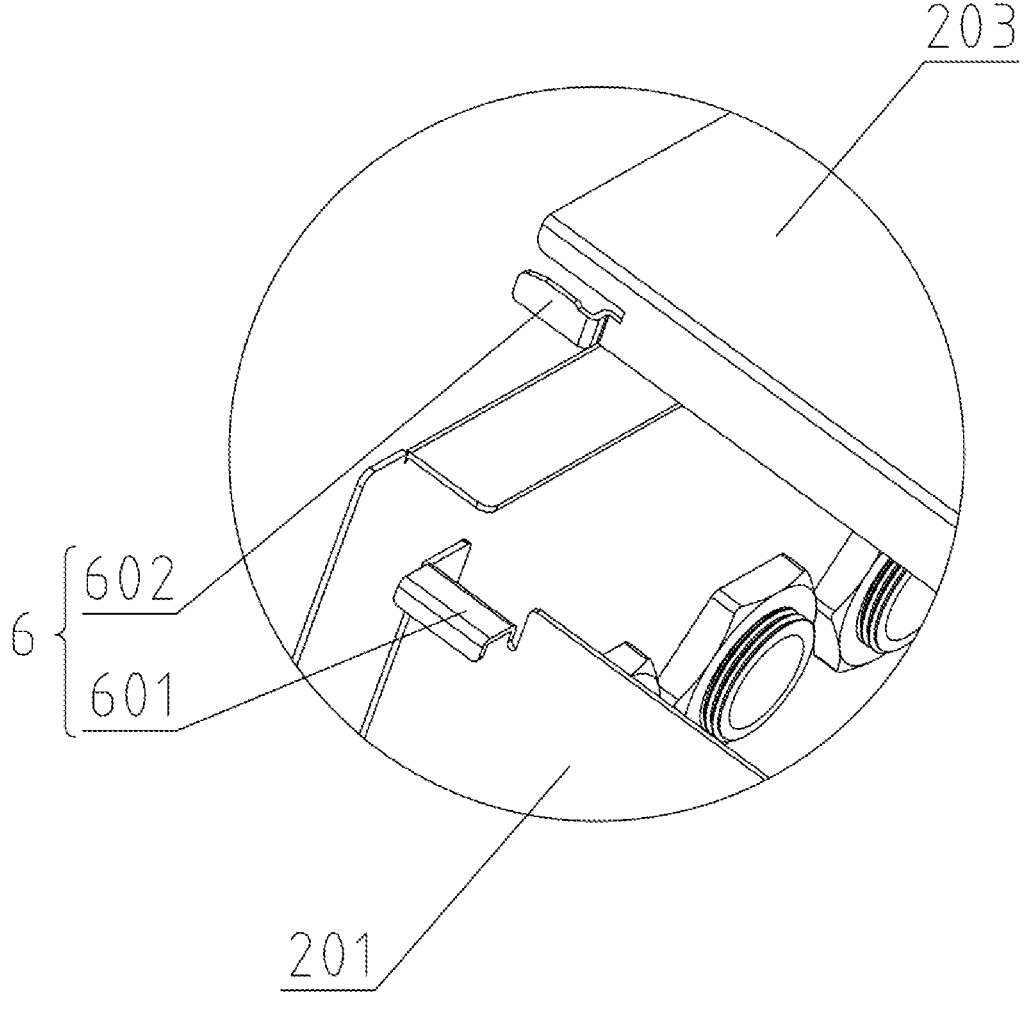
FIG. 7 is an enlarged view of detail B in FIG. 6.
Figure 8:
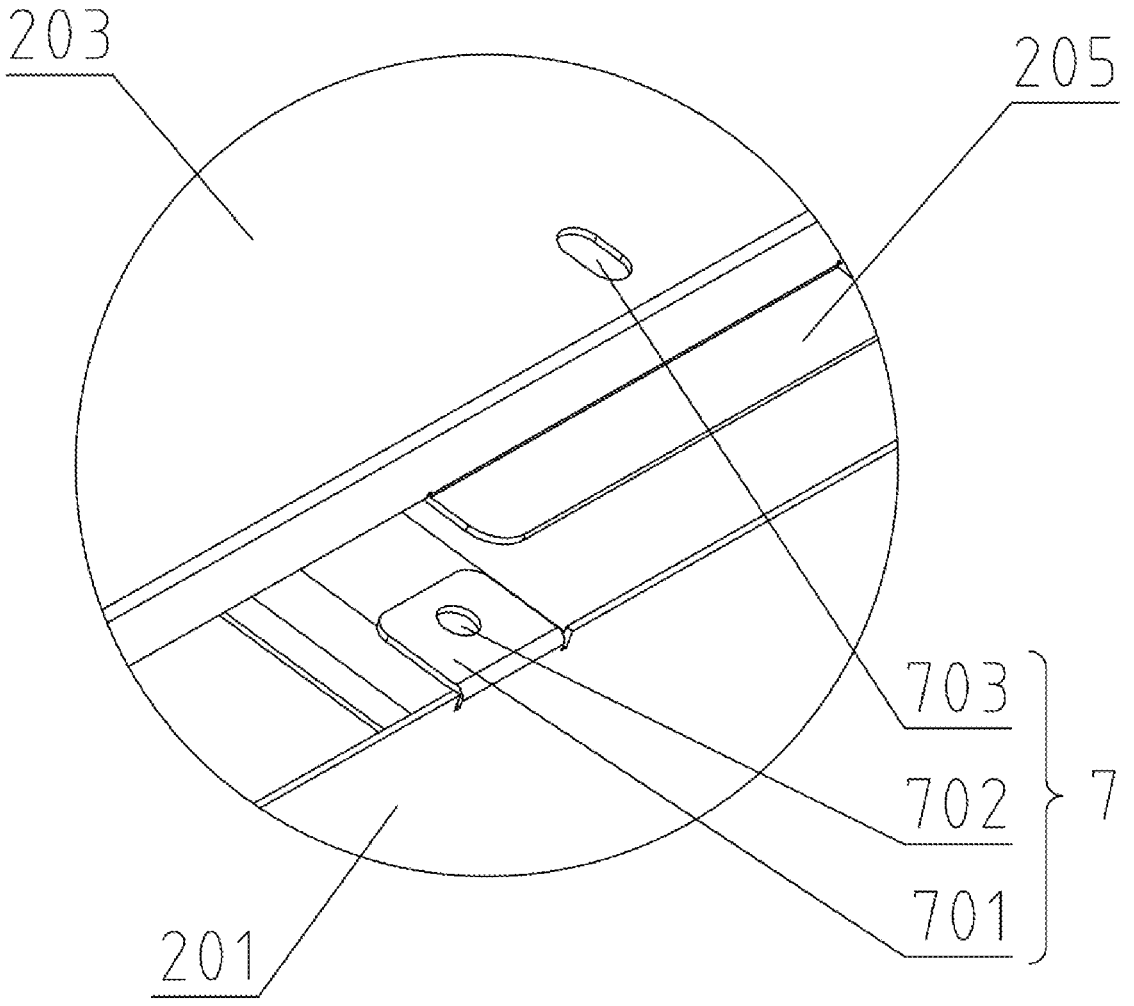
FIG. 8 is an enlarged view of detail C in FIG. 6.

As shown in FIGS. 6 to 8, preferably, the electric control box assembly 2 comprises a box body 201, an electric control component 202 provided in the box body 201, and a box cover 203 covered on the box body 201, and both sides of the box body 201 are provided with abutting elements 204 abutting against the connecting plate 301, respectively. A fastener is provided through the abutting elements 204 and the connecting plate 301 to keep the electric control box assembly 2 in an assembled state. In this embodiment, the fastener comprises a bolt and a nut. After the supporting rod 401 is released from the fixed connection relationship with the electric control box assembly 2, the electric control box assembly 2 rotates around the hinge 5 under the action of gravity until the abutting element 204 abuts against the connecting plate 301. At this time, the bolt is provided through the abutting element 204 and the connecting plate 301 in sequence and is screwed with the nut, so that the electric control box assembly 2 is fixedly connected with the connecting plate 301, which has the advantages of a simple structure and a high assembly efficiency.

Preferably, the box body 201 and the box cover 203 are detachably connected through a fastening mechanism 6 and a locking mechanism 7, the fastening mechanism 6 comprises fastening flanges 601, which are provided at both sides of the box body 201, respectively, and fastening protrusions 602, which are provided at both sides of the box cover 203, respectively, and the fastening protrusions 602 are in clamping connection with the fastening flanges 601; the locking mechanism 7 comprises a positioning plate 701 provided on the box body 201, the positioning plate 701 is provided with a first through hole 702, and the box cover 203 is provided with a second through hole 703, and a fastener is provided through the second through hole 703 and the first through hole 702 to fixedly connect the box cover 203 to the box body 201; the box cover 203 is further provided with a handle 205. In this embodiment, the box body 201 is bent and formed with a fastening flange 601. The fastening flange 601 encloses a limiting groove, and the box cover 203 is bent and formed with the fastening protrusion 602. When mounting, the fastening protrusion 602 slides into the fastening flange 601 (that is, the limiting groove). At this time, the second through hole 703 on the box cover 203 corresponds to the first through hole 702 on the box body 201. The fastener passes through the second through hole 703 and the first through hole 702 to fixedly connect the box cover 203 to the box body 201, which has the advantages of a simple structure, a convenient and quick mounting and disassembling process and a high maintenance efficiency. One side of the box cover 203 close to the locking mechanism 7 is formed with a handle 205 extending outward, which is convenient for the maintainer to lift the electric control box assembly 2 through the handle 205.

Figure 9:
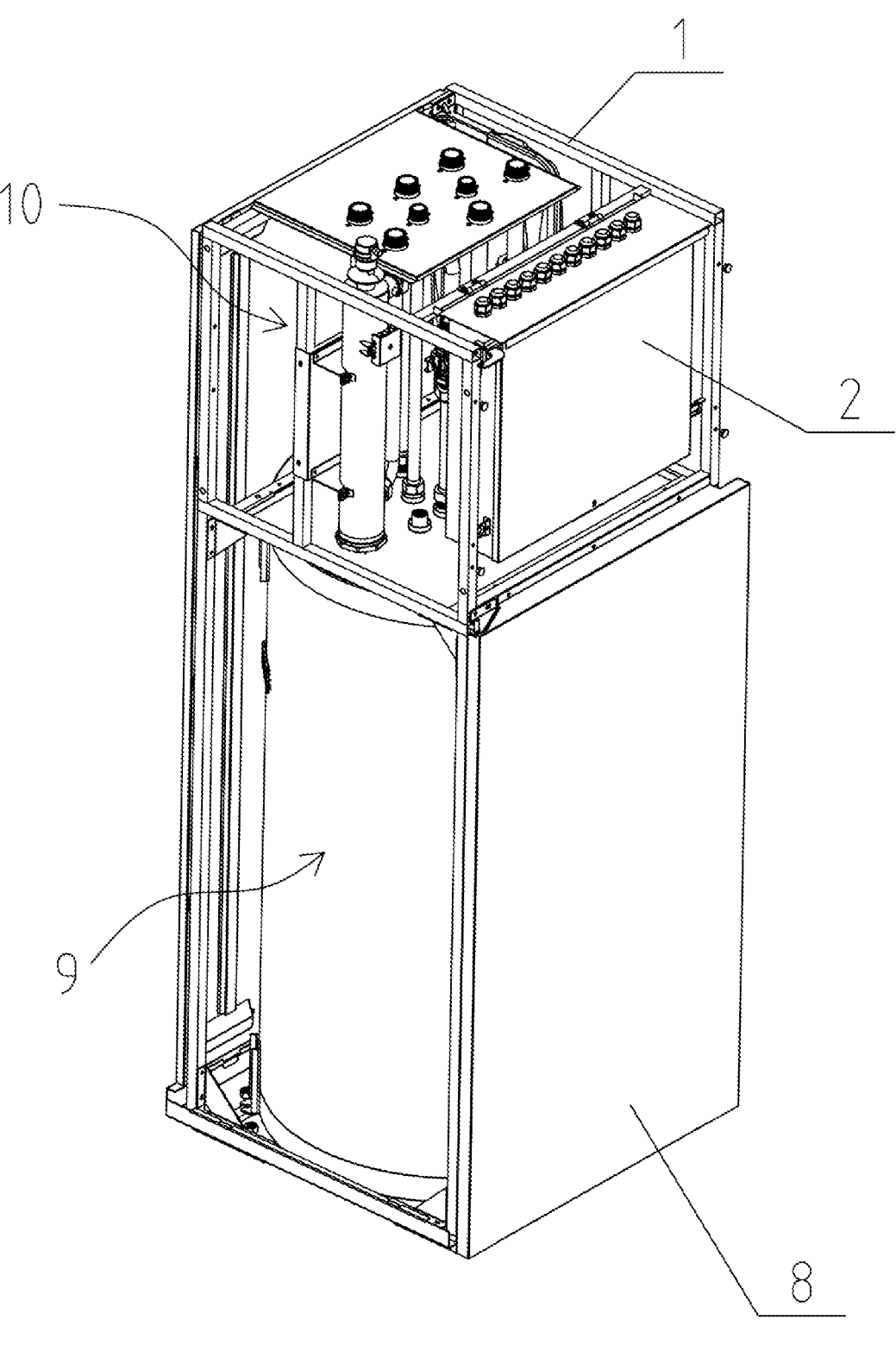
FIG. 9 is a schematic structural view of a heat pump device.

As shown in FIG. 9, the purpose of the present disclosure is to provide a heat pump device, which comprises a tank body 8, a water tank assembly 9 and a hydraulic module 10. The upturned electric control box mounting structure is mounted on the tank body 8. The water tank assembly 9 and the hydraulic module 10 are electrically connected with the electric control box assembly 2. The heat pump device comprises a tank body 8. A water tank assembly 9 is provided in the tank body 8. A hydraulic module 10 is provided above the water tank assembly 9. An upturned electric control box mounting structure for accommodating the hydraulic module 10 is further mounted on the tank body 8, wherein the upturned electric control box mounting structure comprises a connecting frame 1 and an electric control box assembly 2. An accommodating space is provided in the connecting frame 1. The electric control box assembly 2 is connected to the connecting frame 1 in an upturned manner. When the electric control box assembly 2 is in an assembled state, the electric control box assembly 2 and the hydraulic module 10 are integrally located in an accommodating space, so that the electric control box assembly has the advantages of a compact structure and a small occupied space. When the hydraulic module 10 needs to be overhauled, the electric control box assembly 2 is upturned and kept in the overhaul state, and the whole electric control box assembly 2 is located outside the accommodating space, which can avoid the interference and obstruction to the maintainer, effectively reduce maintenance difficulty and improve overhaul efficiency. It is more convenient to use.

Specifically, the heat pump device has the technical effect of the above-mentioned upturned electric control box mounting structure, including the heat pump device comprising the water tank assembly 9, the hydraulic module 10 and the electric control box assembly 2. The working process and principle belong to the mature prior art, which can be found from relevant literatures, so that the working process and principle of the heat pump device are not described in detail here.

The above is only the preferred embodiment of the present disclosure, and the scope of protection of the present disclosure is not limited to the above embodiments. For those skilled in the art, the improvements and variations obtained without departing from the technical concept of the present disclosure should also be regarded as the scope of protection of the present disclosure.

What is claimed is:

1. An upturned electric control box mounting structure, comprising a connecting frame (1) and an electric control box assembly (2), wherein the electric control box assembly (2) is connected to the connecting frame (1) in an upturned manner and is capable of being switched between an assembled state and an overhaul state through an overturning action, and the connecting frame (1) is provided with a fixing mechanism (3) for keeping the electric control box assembly (2) in an assembled state and a supporting mechanism (4) for keeping the electric control box assembly (2) in an overhaul state;

wherein the connecting frame (1) comprises a first side frame (101) and a second side frame (102), a first upper connecting pipe (103) and a second upper connecting pipe (104) are fixedly connected between the first side frame (101) and the second side frame (102), and the electric control box assembly (2) is rotatably connected to the first upper connecting pipe (103) through several groups of hinges (5);

wherein the fixing mechanism (3) comprises at least two groups of connecting plates (301) detachably connected with the electric control box assembly (2), and at least one group of connecting plates (301) are provided on the first side frame (101) and the second side frame (102), respectively; the connecting plate (301) is rotatably connected to the first side frame (101) and the second side frame (102) and is capable of being switched between a storage state and a connecting state by a rotating action.

2. The upturned electric control box mounting structure according to claim 1, wherein the connecting plate (301) is provided with an abutting part (302) abutting against the first side frame (101) or the second side frame (102) to position the connecting plate (301) in a connected state.

3. The upturned electric control box mounting structure according to claim 2, wherein the supporting mechanism (4) comprises at least two groups of supporting rods (401) detachably connected with the electric control box assembly (2), and at least one group of supporting rods (401) are provided on the first side frame (101) and the second side frame (102), respectively.

4. The upturned electric control box mounting structure according to claim 3, wherein the supporting rod (401) is capable of being switched between a storage state and a connected state by a rotating action.

5. The upturned electric control box mounting structure according to claim 1, wherein the electric control box assembly (2) comprises a box body (201), an electric control component (202) provided in the box body (201), and a box cover (203) covered on the box body (201), and both sides of the box body (201) are provided with abutting elements (204) abutting against the connecting plate (301), respectively.

6. The upturned electric control box mounting structure according to claim 5, wherein the box body (201) and the box cover (203) are detachably connected through a fastening mechanism (6) and a locking mechanism (7), the fastening mechanism (6) comprises fastening flanges (601), which are provided at both sides of the box body (201), respectively, and fastening protrusions (602), which are provided at both sides of the box cover (203), respectively, and the fastening protrusions (602) are in clamping connection with the fastening flanges (601);

the locking mechanism (7) comprises a positioning plate (701) provided on the box body (201), the positioning plate (701) is provided with a first through hole (702), and the box cover (203) is provided with a second through hole (703);

the box cover (203) is further provided with a handle (205).

7. A heat pump device, comprising a tank body (8), a water tank assembly (9) and a hydraulic module (10), wherein the upturned electric control box mounting structure according to claim 1 is mounted on the tank body (8), and the water tank assembly (9) and the hydraulic module (10) are electrically connected with the electric control box assembly (2).

* * * * *